US009767229B2

(12) United States Patent
Calderon et al.

(10) Patent No.: US 9,767,229 B2
(45) Date of Patent: Sep. 19, 2017

(54) METHOD OF SIMULATION OF UNSTEADY AERODYNAMIC LOADS ON AN EXTERNAL AIRCRAFT STRUCTURE

(71) Applicant: AIRBUS OPERATIONS (SAS), Toulouse (FR)

(72) Inventors: Raul Calderon, Toulouse (FR); Christophe David, Mondonville (FR)

(73) Assignee: Airbus Operations (S.A.S.), Toulouse (FR)

( * ) Notice: Subject to any disclaimer, the term of this patent is extended or adjusted under 35 U.S.C. 154(b) by 1044 days.

(21) Appl. No.: 14/023,981

(22) Filed: Sep. 11, 2013

(65) Prior Publication Data
US 2014/0081609 A1   Mar. 20, 2014

(30) Foreign Application Priority Data

Sep. 11, 2012 (FR) .................................... 12 58516

(51) Int. Cl.
*G01M 9/06* (2006.01)
*G06F 17/50* (2006.01)

(52) U.S. Cl.
CPC ......... *G06F 17/5009* (2013.01); *G01M 9/065* (2013.01)

(58) Field of Classification Search
CPC ............ G01M 9/065; G01M 9/06; G01P 1/00
See application file for complete search history.

(56) References Cited

U.S. PATENT DOCUMENTS

| 4,727,751 A | * | 3/1988 | Holmes ..................... G01P 5/12 |
| | | | 73/147 |
| 5,926,399 A | * | 7/1999 | Berkooz ............. G06F 17/5018 |
| | | | 703/7 |

(Continued)

FOREIGN PATENT DOCUMENTS

FR       2 946 430       12/2010

OTHER PUBLICATIONS

Abdul M. Rampurawala and Ken J. Badcock, Treatment of Forced Flap Motions for Aeroelastic Simulations of an Arrow Wing, 2005, CFD Laboratory Dept. of Aerospace Engineering, University of Glasgow, United Kingdom.*

(Continued)

*Primary Examiner* — Omar Fernandez Rivas
*Assistant Examiner* — Justin C Mikowski
(74) *Attorney, Agent, or Firm* — Nixon & Vanderhye P.C.

(57) ABSTRACT

The invention relates to a method for simulating the unsteady aerodynamic loads being exerted on the external structure of an aircraft, notably in the context of a simulation of the buffeting of a wing surface in an airflow. The method includes a step of measurement of pressure (410) at different points of a grid, a step of calculation of the spectral density at these points (420) followed by extrapolation/interpolation operations to calculate the missing measurements (430), a step of estimation of the pressure coherence (440) for each pair of points of the grid, a step of estimation of the interspectral pressure density (450) for these same pairs of points, from the coherence thus estimated, and a step of calculation of the aerodynamic loads (460) by summing the real part of the interspectral density for the area of the wing surface having a separation of the boundary layer.

9 Claims, 4 Drawing Sheets

(56) References Cited

U.S. PATENT DOCUMENTS

| | | | | |
|---|---|---|---|---|
| 6,752,020 | B1* | 6/2004 | Sobotta | B64D 47/00 73/702 |
| 7,127,948 | B2* | 10/2006 | Tavares | G01L 9/008 310/326 |
| 7,150,427 | B1* | 12/2006 | Praisner | G01M 9/065 244/1 R |
| 7,258,000 | B2* | 8/2007 | Tavares | G01M 9/06 73/170.01 |
| 8,359,916 | B2* | 1/2013 | Karikomi | G01M 9/04 73/147 |
| 8,666,715 | B2* | 3/2014 | Velazquez Lopez | G06F 17/5018 701/1 |
| 8,761,970 | B2* | 6/2014 | McIntyre | B64C 13/503 340/975 |
| 9,317,633 | B2* | 4/2016 | Calmels | G06F 17/5009 |
| 2006/0179933 | A1* | 8/2006 | Cochran | G01M 9/065 73/170.02 |
| 2010/0036648 | A1* | 2/2010 | Mangalam | G06F 17/5009 703/2 |
| 2010/0170333 | A1* | 7/2010 | Hucker | G01F 1/692 73/147 |
| 2010/0266405 | A1* | 10/2010 | Mayda | G01M 9/06 416/61 |
| 2010/0312497 | A1* | 12/2010 | Jenaro Rabadan | G01M 9/04 702/42 |
| 2011/0246097 | A1* | 10/2011 | Mangalam | G01M 9/065 702/43 |
| 2011/0285550 | A1* | 11/2011 | Maris | G01M 9/065 340/966 |
| 2012/0089375 | A1* | 4/2012 | Kordt | G05B 13/04 703/1 |
| 2014/0207429 | A1* | 7/2014 | Spira | G06F 17/5009 703/2 |

OTHER PUBLICATIONS

Anthony Jameson, Computational Aerodynamics for Aircraft Design, Jul. 28, 1989, sciencemag.org, Aricles 361.*
David J. Piatak et. al., Ares Launch Vehicle Transonic Buffet Testing and Analysis Techniques, Sep. 2012, Journal of Spacecraft and Rockets, vol. 49, No. 5.*
Anthony S. Pototzky and Robert W. Moses, A Method to Analyze Tail Buffet Loads of Aircraft, Apr. 2005, RTO-AVT-123/RSY, 19-1 to 19-14.*
French Search Report for FR Application No. 12 58516, dated Aug. 8, 2013, Lerbinger, Klaus, 1 page.
Thesis of S. Soumillon entitled Phenomenology and Modeling of Separated Unsteady Aerodynamic Flows for Forecasting of Aeroelastic Phenomena Relating to the Buffeting of Civil Aircraft, Supaero Thesis, 2002, 138 pages.

* cited by examiner

METHOD OF SIMULATION OF UNSTEADY AERODYNAMIC LOADS ON AN EXTERNAL AIRCRAFT STRUCTURE

This application claims priority to France Application No. 12 58516, filed Sep. 11, 2012, the entire contents of which is hereby incorporated by reference.

TECHNICAL FIELD

The present invention relates generally to the aerodynamics field, and more specifically that of the simulation of unsteady aerodynamic loads on an external aircraft structure.

STATE OF THE PRIOR ART

The phenomenon of buffeting of a wing surface is well known in the aerodynamics field. It is principally due to the separation of the boundary layer in certain areas on the wing surface. This phenomenon leads to a generation of unsteady pressure fluctuations in the separation area, and the origination of vortexes which themselves cause vibrations of the wing surface.

Since the buffeting phenomenon reduces the aircraft's flight envelope it must be taken into account from the design phase. If it is not, it is difficult to correct it retrospectively, and this correction may prove very disadvantageous in terms of time and development cost. Simulation of the buffeting of a wing surface with a satisfactory degree of reliability is consequently essential to allow the shape and/or structure of the wing surface to be corrected in the design phase, and to prevent any certification problems thereafter.

A first method of simulation of the buffeting of a wing surface was described in the thesis of S. Soumillon entitled "Phenomenology and modelling of separated unsteady aerodynamic flows for forecasting of aeroelastic phenomena relating to the buffeting of civil aircraft", Supaero thesis, 2002.

This method is in fact based on a form of semi-empirical modelling, combining wind tunnel measurements and digital simulations.

The modelling takes into account two separate phenomena: the unsteady aerodynamic loads (or forces) due to the instability of the flow on the wing surface (separation of the boundary layer, in particular a shockwave), and the aerodynamic forces caused by the movements of the structure of the wing surface.

The modelling is based on the hypothesis that aerodynamic forces caused by the movement of the structure are not affected by the separation of the boundary layer and that, reciprocally, unsteady aerodynamic loads due to instability of the flow are not affected by the movements of the structure.

Taking this hypothesis of independence, the movement of the structure may be obtained by the following aeroelasticity equation:

$$M\ddot{z}+C\dot{z}+Kz=F_{induced}(z,\dot{z})+F_{excitation}(t) \quad (1)$$

where z represents the coordinate orthogonal to the plane of the wing surface, M is the mass matrix, C is the damping matrix and K is the stiffness matrix, $F_{induced}$ represents the resulting aerodynamic forces and $F_{excitation}$ represents the unsteady aerodynamic loads due to the instability of the flow. Equation (1) is then used to model the dynamic deformation of the structure. A state model is used to model the coupling between the fluid and the structure.

The resulting aerodynamic forces $F_{induced}$ may be approximated as a linear function of the deformations and of the speeds of deformation of the different points of the structure. A simplified elasticity equation is then obtained:

$$M\ddot{z}+C'\dot{z}+K'z=F_{excitation}(t) \quad (2)$$

where matrices C', K' are determined from matrices C, K and from the resultant aerodynamic forces. Matrices C', K' are respectively called the damping and stiffness matrices of the structure in wind.

Resolution of equation (2) presupposes that the unsteady aerodynamic loads $F_{excitation}(t)$ are known. A first method consists in measuring these loads using pressure sensors distributed across the wing surface during tests in a wind tunnel model. However, in practice, the number of these sensors is greatly insufficient due to the spatial limitation on the model and the high cost of these sensors.

FIG. 1 represents schematically a grid of sensors positioned on a model of the wing surface. The x axis is the chord of the wing, and the y axis is the wing span.

The pressure sensors, designated by reference 110, are positioned only at certain points of the grid, and the missing measurements are replaced by means of interpolation.

It is difficult to use the random character of the pressure measurements in the time domain; for this reason, for each sensor, the spectral amplitude of pressure signal $ã_{xy}(f)$ is determined, where the spectral amplitude is calculated as an average of the Fourier transforms of the pressure measured by the sensor (at coordinates point x,y). It was observed in the abovementioned thesis that the curve of the spectral amplitude of the pressure did not vary according to the wing span, and that the curve of the spectral pressure amplitude varied according to the chord. These properties enable the missing measurements to be replaced by measurements calculated by interpolation of the existing measurements.

More specifically, the measurements are firstly interpolated in the direction of the wing span. For a gap represented symbolically by a cross, 120, the spectral amplitude of the missing measurement, $ã_{xy}(f)$ is obtained by calculating, firstly, the ratio of the spectral amplitudes to the closest chord section (in this case sensors 120' and 121') and by applying this coefficient to sensor 121 in order to obtain the amplitude of sensor 120. Once each column of the grid has been completed in this manner, any missing columns, represented by empty circles 130, are then added. More specifically, the spectral amplitude of the pressure measurement at point 130 is obtained by means of a linear interpolation between the spectral amplitudes of the measurements relative to sensors 131 and 132.

A spectral amplitude $ã_{xy}(f)$ is associated with each coordinates point (x,y) in the grid. A random phase function, $\phi_{xy}(t)$, is then associated with each point of the grid. More specifically, for each coordinates point (x,y) of the grid, a random sampling is undertaken, giving the change of phase of the pressure signal as a function of time. The phase functions at different points are chosen such that they conform with a spatial correlation matrix measured between the different sensors. Pressure $p_{xy}(t)=a_{xy}(t)e^{j\phi_{xy}(t)}$ is then obtained by the following successive operations:

$$\tilde{\phi}_{xy}=TF(\phi_{xy}(t)) \quad (3\text{-}1)$$

$$\tilde{p}_{xy}(f)=\tilde{a}_{xy}(f)e^{j\tilde{\phi}_{xy}(f)} \quad (3\text{-}2)$$

$$p_{xy}(t)=TF^{-1}(\tilde{p}_{xy}(f)) \quad (3\text{-}3)$$

where $TF^{-1}$ designates the inverse Fourier transform. Time signals $p_{xy}(t)$ are in conformity with the statistical properties of the signals measured by the sensors.

By integrating pressure $p_{xy}(t)$ over the separation area of the boundary layer, it is then possible to obtain unsteady aerodynamic loads $F_{excitation}$ for the model. The aerodynamic loads for the real wing surface are obtained by a change of scale, and this aspect will consequently be disregarded.

The method of simulation described above requires, however, that a large number of operations are made for each sensor (at least one Fourier transform and one inverse Fourier transform for each grid point). In addition, these Fourier/inverse Fourier transforms are of course undertaken in practice using FFTs/IFFTs which, due to the discretisation which they introduce, lead to a relatively inaccurate approximation of the unsteady pressure.

The aim of the present invention is to propose a method of computer simulation of the unsteady aerodynamic loads on a wing surface and, more generally, on an external structure of an aircraft, which requires less computation than the existing method, and which is able to provide a more accurate estimation of these loads.

DESCRIPTION OF THE INVENTION

The present invention is defined by a method of computer simulation of the unsteady aerodynamic loads being exerted on an external structure of an aircraft, positioned in an airflow, where the said method includes:

(a) a step of measurement of pressure by multiple sensors located on the surface of the said structure, and positioned at the first points of a grid having a first direction in the flow direction, and a second direction, separate from the first, where the pressure signals of the said sensors are stored in a memory;

(b) a step of calculation of the spectral density of the pressure signals at the said first points of the grid;

(c) a step of extrapolation/interpolation of the spectral pressure density in order to obtain a spectral pressure density at second points of the grid not having sensors;

(d) a step of estimation of the coherence of the pressure for multiple pairs of points of the grid, from a predetermined model of the coherence function;

(e) a step of calculation of the interspectral pressure density for the said multiple pairs of points of the grid, from the coherence of the pressure estimated for these pairs of points, and the spectral density calculated for the points of these pairs;

(f) a step of calculation of the said aerodynamic loads by summing the real part of the interspectral density on the area of the external structure having a separation of the boundary layer of the said flow.

Preferably, in step (c), the spectral pressure density is extrapolated in linear fashion in the second direction and interpolated using an interpolation polynomial of degree greater than or equal to three in the first direction.

Also preferably, in step (d), the model of the coherence function, for a pair (n,m) of points of the grid, is given by:

$$\gamma_{nm}(f) = \exp\left(-2\pi f\left(\frac{|x_m - x_n|}{\alpha_x(f)} + \frac{|y_m - y_n|}{\alpha_y(f)}\right)\right) \cdot \exp(j\varphi(f, x_m - x_n, y_m - y_n))$$

$$\varphi(f, x_m - x_n, y_m - y_n) = 2\pi f\left(\frac{x_m - x_n}{V_x} + \frac{y_m - y_n}{V_y}\right)$$

where $x_n, y_n$ are the respective coordinates of the first point of the pair of points in the first and second directions; $x_m, y_m$ are the respective coordinates of the second point of the pair of points in the first and second directions, $V_x$ is the speed of propagation of the points of instability in the first direction; $V_y$ is the speed of propagation of the points of instability in the second direction, f is the frequency; $\alpha_x(f)$ is a decoherence factor in the first direction and $\alpha_y(f)$ is a decoherence factor in the second direction.

According to an advantageous embodiment, the decoherence factor in the first direction is estimated by the following average:

$$\hat{\alpha}_x(f) = -\frac{2\pi f \Delta x}{K} \sum_{k=1}^{K} \frac{1}{\ln(|\gamma_k^{\Delta x}(f)|)}$$

where $\gamma_k^{\Delta x}(f)$ is the coherence at frequency f between pressure signals measured respectively by two sensors separated by a distance $\Delta x$ in the first direction, and the decoherence factor in the second direction is estimated by the following average:

$$\hat{\alpha}_y(f) = -\frac{2\pi f \Delta y}{K} \sum_{k=1}^{K} \frac{1}{\ln(|\gamma_k^{\Delta y}(f)|)}$$

where $\gamma_k^{\Delta y}(f)$ is the coherence, at frequency f, of the pressure signals measured respectively by two sensors separated by a distance $\Delta y$ in the second direction, and where K is the number of measurements considered for the average.

In addition, the speed of propagation of the points of instability in the first direction may be estimated from the following average:

$$\hat{V}_x = \frac{2\pi}{\text{card}(\Omega x)} \sum_{n,m \in \Omega x} \frac{\Delta x_{nm}}{\lambda_{nm}}$$

where $\lambda_{nm}$ is the gradient of the coherence phase, as a function of frequency, of the pressure signals measured respectively by two sensors n,m separated by a relative distance $\Delta x_{nm} = x_m - x_n$ in the first direction, and $\Omega x$ is a first set of pairs of sensors;

and the speed of propagation of the points of instability in the second direction may be estimated from an average of the following gradient:

$$\hat{V}_y = \frac{2\pi}{\text{card}(\Omega y)} \sum_{n,m \in \Omega y} \frac{\Delta y_{nm}}{\mu_{nm}}$$

Where $\mu_{nm}$ is the gradient of the coherence phase, as a function of frequency, of the pressure signals measured respectively by two sensors n,m separated by a relative distance $\Delta y_{nm} = y_m - y_n$ in the second direction, and $\Omega y$ is a second set of pairs of sensors, The speed of propagation of the points of instability in the first direction and/or in the second direction is preferably obtained for pairs of sensors the measured pressure signals of which have a coherence module greater than a predetermined threshold ($\chi_{Th}$).

According to an advantageous embodiment of step (e), the interspectral pressure density for a pair of points of the grid is obtained by:

$$S_{nm}(f)=\gamma_{nm}(f)\sqrt{S_{nn}(f)}\sqrt{S_{mm}(f)}$$

where $\gamma_{nm}(f)$ is the pressure coherence between the first and second points of the pair of points; $S_{nm}(f)$ is the spectral pressure density at the first point of the pair of points and $S_{nm}(f)$ is the spectral pressure density at the second point of the pair of points.

In step (f), the aerodynamic loads on the external structure are preferably obtained from:

$$F_{excitation}(f) = \sum_{n,m \in \Omega} \text{Re}(S_{nm}(f))\vec{\sigma}_n \vec{\sigma}_m$$

where $S_{nm}(f)$ is the interspectral pressure density between a first point n and a second point m of the grid, f is the frequency, Re(.) designates the real part, where the surface of the external structure is divided into elementary surfaces associated with the different points of the grid, $\vec{\sigma}_n$ is the vector with norm equal to the elementary surface associated with first point n and orthogonal to the external structure at this point, and $\vec{\sigma}_m$ is the vector with norm equal to the elementary surface associated with second point m and orthogonal to the external structure at this point, where the summation of the interspectral density is accomplished for a set $\Omega$ of pairs of points of the grid belonging to the area of the external structure having a separation of the boundary layer of the said flow.

The invention also relates to a method of simulation by computer of the buffeting of an external structure of an aircraft in an airflow, according to which a simulation is made of the unsteady aerodynamic loads, $F_{excitation}(f)$, being exerted on this external structure according to the simulation method described above, and the equation is resolved to the following vibrations:

$$M\ddot{z}+C'\dot{z}+K'z=F_{excitation}$$

where M is the mass matrix of the external structure, C' and K' are respectively the damping and rigidity matrices of the said structure in the wind, and z is the coordinate in the direction orthogonal to the plane of the external structure.

BRIEF DESCRIPTION OF THE ILLUSTRATIONS

Other characteristics and advantages of the invention will appear on reading a preferential embodiment of the invention, made in reference to the attached figures, among which:

DETAILED DESCRIPTION OF PARTICULAR EMBODIMENTS

The method of simulation by computer described below relates to the estimation of the aerodynamic loads on an external structure of an aircraft, also designated more simply as the "structure" in the remainder of the description. The expression "external structure of an aircraft" is understood in this case to mean an element of the aircraft subject in the course of the flight to an airflow at its surface, such as a wing surface or an empennage, for example. This method uses, as above, a semi-empirical model.

Figure 1:
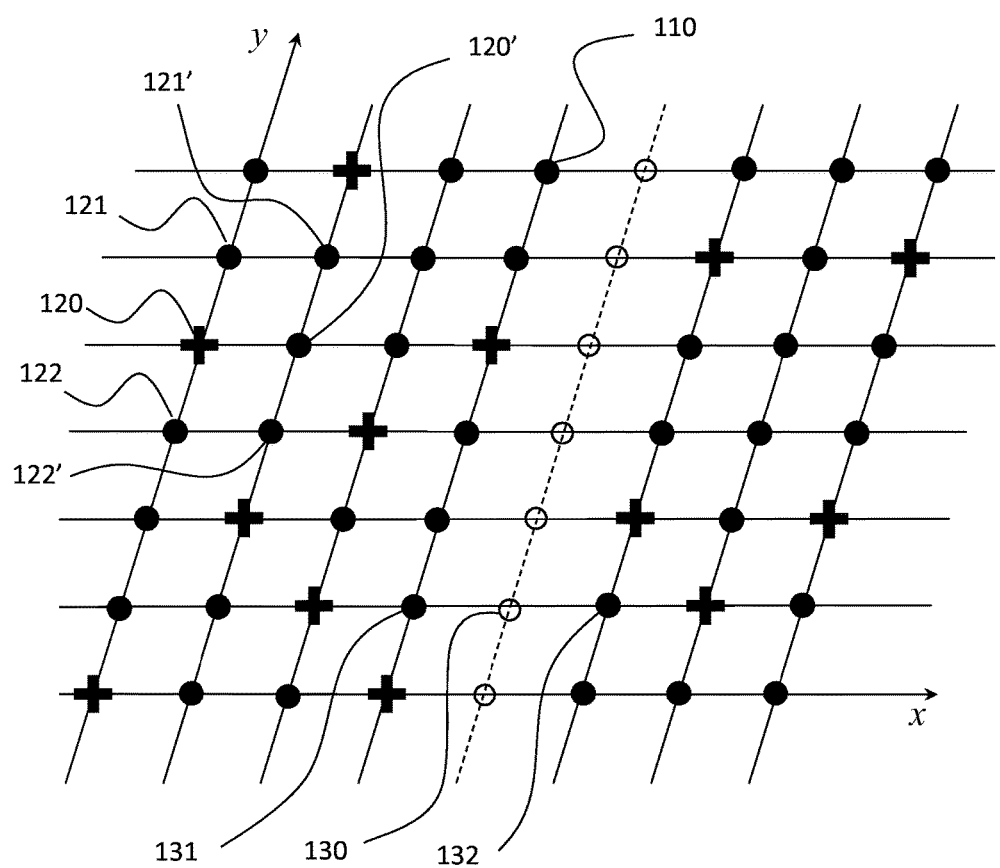
FIG. 1 represents diagrammatically a grid of pressure measurement sensors for an aircraft wing surface.

More specifically, a model of the structure, equipped with pressure sensors, is firstly subjected to a measuring campaign in a wind tunnel. This campaign enables the unsteady pressures at different points of a measuring grid on the surface of the said structure to be determined. The grid has a first direction Ox in the direction of the flow, and a second direction Oy separate from the first. For example, if the structure is a wing surface the first direction could be the chord and the second direction the wing span, as illustrated in FIG. 1. The lines of the grid are aligned in the first direction and the columns of the grid are aligned in the second direction.

The coordinates of a point at the intersection of a column i and of a line j of this grid will be noted (i,j), δx is the grid interval in the first direction and δy is the grid interval in the second direction. In what follows the points of the grid are, in addition, indexed by n=1, . . . N. The sensors will be indexed by the indices of the points of the grid where they are located.

For each sensor n present at a point (i,j) of the grid the spectral density $S_{nn}(f)$ of the pressure signal is firstly determined by:

$$S_{nn}(f) = \lim_{T \to \infty} \left( \frac{1}{T} E(\tilde{P}_n(f) \cdot \tilde{P}_n^*(f)) \right) \quad (4)$$

where E(.) designates the expectation, $\tilde{P}_n^*(f)$ is the conjugate of $\tilde{P}_n(f)$ and $\tilde{P}_n(f)=TF(P_n(t))$ is the Fourier transform of the pressure signal, $P_n(t)$ measured by sensor n, over a time interval T. It is recalled that the spectral density of a signal gives the frequency distribution of the energy of this signal. In practice it is supposed that the hypothesis of ergodicity is checked, and the expectation is calculated in (4) by averaging $\tilde{P}_n(f) \cdot \tilde{P}_n^*(f)$, over several time intervals T.

For each pair of sensors n,m, the interspectral density of the pressure signals measured respectively by these sensors is then determined. The interspectral density of the pressure signals of sensors n,m, $S_{nm}(f)$ is given by:

$$S_{nm}(f) = \lim_{T \to \infty} \left( \frac{1}{T} E(\tilde{P}_n(f) \cdot \tilde{P}_m^*(f)) \right) \quad (5)$$

where $\tilde{P}_n(f)=TF(P_n(t))$ is the Fourier transform of the pressure signal, $P_n(t)$, measured by the first sensor and $\tilde{P}_m(f)=TF(P_m(t))$ is the Fourier transform of the pressure signal, $P_m(t)$, measured by the second sensor. It is recalled that the interspectral density of two signals gives the distribution of the energy common to these two signals according to the frequency. Due to the combination in expression (5) it also gives, for each frequency, information concerning the phase shift between the two pressure signals. In the same manner as for the spectral density, the expectation in (5) is calculated, in practice, by averaging $\tilde{P}_n(f) \cdot \tilde{P}_m^*(f)$, over several time intervals T.

The coherence function between the pressure signals of two sensors is defined by:

$$\gamma_{nm}(f) = \frac{S_{nm}(f)}{\sqrt{S_{nn}(f)} \sqrt{S_{mm}(f)}} \quad (6)$$

Coherence module $|\gamma_{nm}(f)|$ between the two signals is between 0 and 1. When the coherence module is equal to 1, the spectral distributions of the two signals coincide perfectly. Conversely, when the coherence module is equal to 0, the two signals are entirely decorrelated.

The man skilled in the art will understand that the calculation of the spectral pressure of the measuring signals and of the interspectral power of the pairs of measuring signals is equivalent to calculating the interspectral matrix of these signals. Indeed, the interspectral matrix of these signals is expressed in the following form:

$$\sum(f) = \begin{pmatrix} S_{11}(f) & S_{12}(f) & \ldots & S_{1N}(f) \\ S_{21}(f) & S_{22}(f) & \ldots & S_{2N}(f) \\ \vdots & \vdots & \ddots & \vdots \\ S_{N1}(f) & S_{N2}(f) & \ldots & S_{NN}(f) \end{pmatrix} \quad (7)$$

Matrix $\Sigma(f)$ is hermitian and positive.

In the same way, the coherence matrix of the signals may be defined by:

$$\Gamma(f) = \begin{pmatrix} 1 & \gamma_{12}(f) & \ldots & \gamma_{1N}(f) \\ \gamma_{21}(f) & 1 & \ldots & \gamma_{2N}(f) \\ \vdots & \vdots & \ddots & \vdots \\ \gamma_{N1}(f) & \gamma_{N2}(f) & \ldots & 1 \end{pmatrix} \quad (8)$$

which, like matrix $\Sigma(f)$, is hermitian and positive.

When the spectral density of the signals of the different pressure sensors has been calculated, this density is estimated for the missing measurements, in other words for the points of the grid with no sensor.

More specifically, the spectral densities for the points of the grid with no sensor are obtained using an operation to extrapolate/interpolate the spectral densities available at points which have a sensor. The spectral density of the missing measurement at 120 may thus be obtained by extrapolation of density of the measurement at 121, using the ratio of the spectral densities obtained in an adjacent column. In other words, spectral density $S_{120}(f)$ at point 120 is obtained, for example, by $$S_{120}(f) = S_{121}(f) \frac{S_{120'}(f)}{S_{121'}(f)},$$

where $S'_{120'}(f)$, $S_{121}(f)$, $S_{121'}(f)$ are the spectral densities of the pressure signal at points 120', 121, 121'.

Once each column of the grid has been completed in this manner any missing columns are then added. Unlike the method of interpolation in relation to the spectral amplitude which is known from the prior art, in this case a polynomial of interpolation of a degree at least equal to 3 is used, for example a cubic spline which gives satisfactory regularity of the spectral density distribution in the first direction of the grid. In other words, to estimate a spectral density at a point 120 (FIG. 1), an interpolation function (of a degree higher than or equal to 3) is applied, passing through the spectral densities of points 131 and 132.

An estimate is then made of the interspectral pressure density for each pair of points of the grid.

This estimate is based on an original modelling of the coherence function. Indeed, it has been possible to show, advantageously, that the coherence function could be modelled in the following form:

$$\gamma_{nm}(f) = \quad (9)$$
$$\exp\left(-2\pi f\left(\frac{|x_m - x_n|}{\alpha_x(f)} + \frac{|y_m - y_n|}{\alpha_y(f)}\right)\right) \cdot \exp(j\varphi(f, x_m - x_n, y_m - y_n))$$

where $\alpha_x(f)$ and $\alpha_y(f)$ are decoherence factors in the first direction and the second direction respectively. $\alpha_x(f)$ and $\alpha_y(f)$ are also called longitudinal and transverse Corcos coefficients.

The multiplicand of expression (11) reflects the decoherence between the pressure signals as a function of the distance between the sensors (or more generally between the points of the grid when the spectral and interspectral densities are obtained by extrapolation/interpolation). It was possible to show that, in quite a surprising manner, the decoherence factors $\alpha_x(f)$ and $\alpha_y(f)$ depended only slightly on the geometry of the structure and on the external conditions of the flow.

The multiplier is a phase term representing the propagation time of the points of instability (i.e. of the vortexes) between the two points of the grid. The $\phi(f, x_m - x_n, y_m - y_n)$ phase depends on the frequency and on the differences of the coordinates of the points of the pair considered:

$$\varphi(f, x_m - x_n, y_m - y_n) = 2\pi f\left(\frac{x_m - x_n}{V_x} + \frac{y_m - y_n}{V_y}\right) \quad (10)$$

where $V_x$ and $V_y$ are respectively the speeds of propagation of the instability (of the vortexes) in the first direction and the second direction.

According to a first variant the decoherence factors are calculated once only after a first measuring campaign.

According to a second variant the decoherence factors are calculated in each campaign, i.e. for each new structure, as follows:

$$\hat{\alpha}_x(f) = -\frac{2\pi f \Delta x}{K} \sum_{k=1}^{K} \frac{1}{\ln(|\gamma_k^{\Delta x}(f)|)} \quad (11\text{-}1)$$

$$\hat{\alpha}_y(f) = -\frac{2\pi f \Delta y}{K} \sum_{k=1}^{K} \frac{1}{\ln(|\gamma_k^{\Delta y}(f)|)} \quad (11\text{-}2)$$

where $\gamma_k^{\Delta x}(f)$ is the coherence function calculated experimentally from expression (6) for two sensors separated by a distance $\Delta x$ (therefore $\Delta x > 0$) in the first direction of the grid, $\gamma_k^{\Delta y}(f)$ is the coherence function calculated experimentally from expression (6) for two sensors separated by a distance $\Delta y$ (therefore $\Delta y > 0$) in the second direction, k is the index of the measurement and K is the number of measurements considered.

It is important to note that the calculations of the decoherence factors according to (11-1) and (11-2) can be made validly only if the measurements of both sensors n,m have a high coherence module, in other words $|\gamma_{nm}(f)| \geq \gamma_{th}$, where $\gamma_{th}$ is a threshold value dependent on the measuring time and the processing accomplished. It was able to be shown that a value of $\gamma_{th} = 0.4$ was suitable in practice.

The propagation speeds of the instability, $V_x$ and $V_y$, are also determined experimentally from the pressure measurements.

More specifically, for a pair n,m of sensors separated by a relative distance $\Delta x_{nm}$ (positive or negative) in the first direction, phase $\phi_{nm}^{\Delta x}(f)$ of the coherence function is determined in relation with the frequency, for different measurements (where each measurement gives a pressure signal which changes over time). The speed of propagation of the instability in the first direction is estimated from an average of gradient $\alpha_{nm}$ of phase $\phi_{nm}^{\Delta x}(f)$ as a function of the frequency:

$$\hat{V}_x = \frac{2\pi}{\text{Card}(\Omega x)} \sum_{n,m \in \Omega x} \frac{\Delta x_{nm}}{\lambda_{nm}} \quad (12\text{-}1)$$

where $\Omega x$ is the set of the pairs of sensors considered for the average in question, and $\text{Card}(\Omega x)$ is the cardinal of $\Omega x$, i.e. the number of pairs of sensors in considered.

Similarly, for a pair of sensors n,m separated by a relative distance $\Delta y_{nm}$ (positive or negative) in the second direction, phase $\phi_{nm}^{\Delta y}(f)$ of the coherence function is determined, together with its gradient $\mu_{nm}$, as a function of the frequency, and the speed of propagation of the instability in the second direction is deduced by means of:

$$\hat{V}_y = \frac{2\pi}{\text{Card}(\Omega y)} \sum_{n,m \in \Omega y} \frac{\Delta y_{nm}}{\mu_{nm}} \quad (12\text{-}2)$$

where $\Omega y$ is the set of the pairs of sensors considered for the average in question, and $\text{Card}(\Omega y)$ is the cardinal of $\Omega y$, i.e. the number of pairs of sensors considered.

Figure 2A:
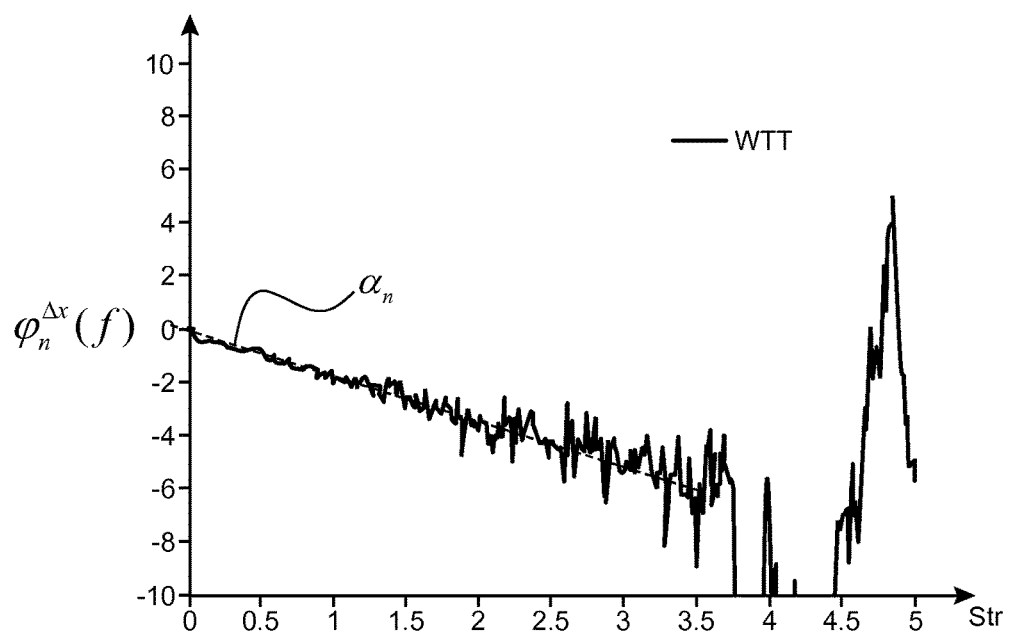
FIG. 2A represents the phase of the coherence function between pressure measurements of two sensors separated in the direction of the wing surface's chord.
Figure 2B:
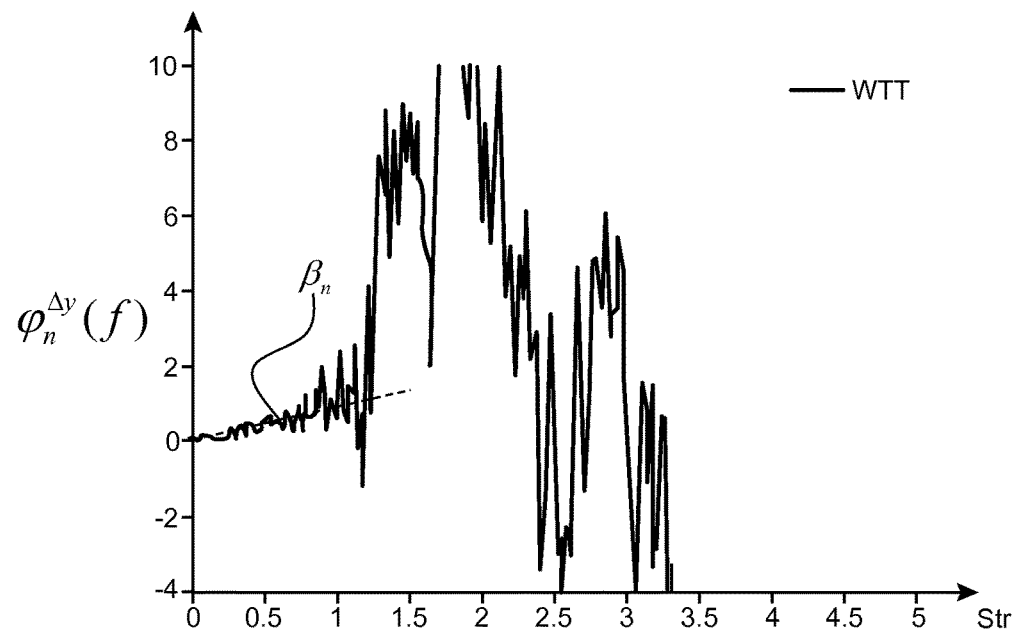
FIG. 2B represents the phase of the coherence function between pressure measurements of two sensors separated in the direction of the wing surface's span.

FIG. 2A represents phase $\phi_{nm}^{\Delta x}(f)$ of the pressure coherence function between two points of the grid separated by a distance $\Delta x_{nm}$ in the first direction. FIG. 2B represents phase $\phi_{nm}^{\Delta y}(f)$ of the pressure coherence function between two points of the grid separated by $\Delta y_{nm}$ in the second direction. In both cases frequency f has been represented in the form of the Strouhal number, V. It is recalled that the Strouhal number is a normalised frequency $$V = \frac{f}{f_\infty}$$

with $$f_\infty = \frac{V_\infty}{L},$$

where $V_\infty$ is the speed of the undisturbed flow and L is a length characteristic of the structure.

It is remarked in the example of FIG. 2A that curve $\phi_{nm}^{\Delta x}(f)$ has a linear portion up to a relatively high Strouhal number. Conversely, in the example of FIG. 2B, curve $\phi_{nm}^{\Delta y}(f)$ has a smaller linear portion. The loss of linearity of the phase is due essentially to the loss of coherence as a function of frequency, since the loss of coherence is more pronounced in the direction of the wing span than in the direction of the chord. It is also noted that the gradient of curve $\phi_n^{\Delta x}(f)$ is higher than that of $\phi_n^{\Delta y}(f)$.

Coherence function $\gamma_{nm}(f)$ of the pressure for two pairs of points of the grid is determined from equations (9) and (10), after the decoherence factors have been estimated by means of (11-1) and (11-2) and the speeds of propagation of the points of instability have been estimated by means of (12-1) and (12-2).

It is then possible to deduce from this the interspectral pressure density between two points n,m of the grid according to (6), or in other words:

$$S_{nm}(f) = \gamma_{nm}(f)\sqrt{S_{nn}(f)}\sqrt{S_{mm}(f)} \quad (13)$$

Lastly, the unsteady aerodynamic loads on the wing surface may be estimated by:

$$F_{excitation}(f) = \sum_{n,m \in \Omega} \text{Re}(S_{nm}(f))\vec{\sigma}_n \vec{\sigma}_m \quad (14)$$

where the summation is made for the set $\Omega$ of pairs of points of the grid belonging to the separation area of the boundary layer, Re(.) means the real part and $\vec{\sigma}_n$ is a vector normal to the surface of the structure at point n having a norm equal to an elementary surface $\sigma_n$ around this point. In other words, the separation surface is divided into elementary surfaces associated respectively with the different points of the grid, and the summation of the real part of the interspectral pressure density is made for these elementary surfaces.

It is understood according to expression (14) that the accuracy of the estimate of the unsteady aerodynamic loads is directly related to that of the real part of the interspectral pressure density.

Figure 3A:
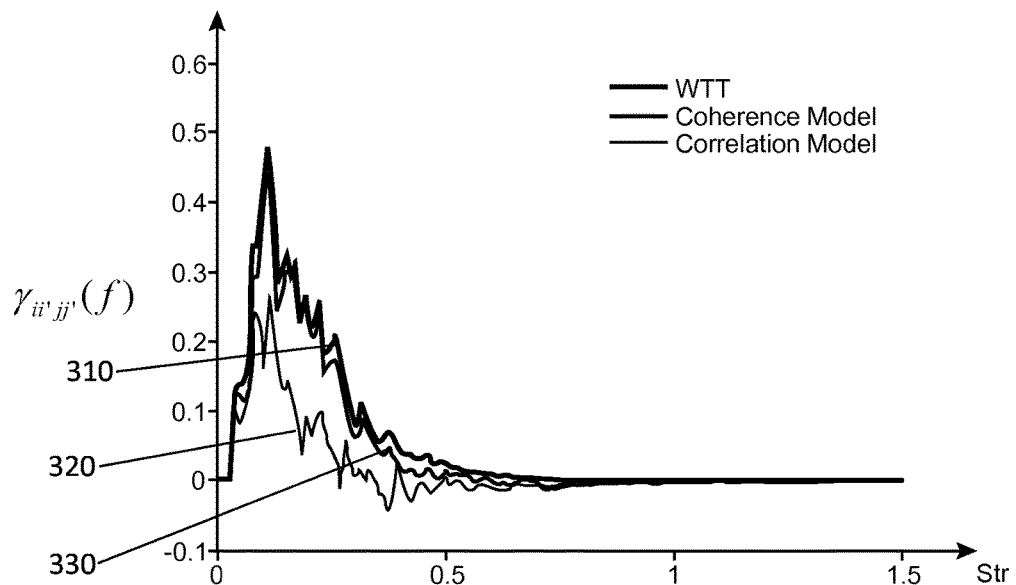
FIG. 3A represents the real part of the interspectral pressure density for two points located close to the leading edge of a horizontal empennage.
Figure 3B:
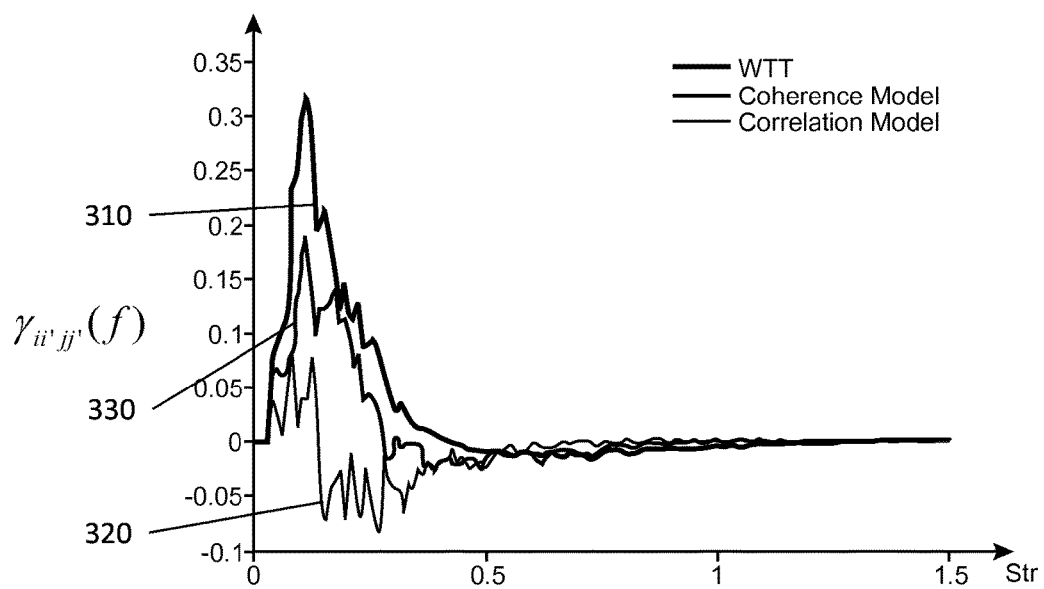
FIG. 3B represents the real part of the interspectral pressure density for two points located close to the trailing edge of a horizontal empennage.

In FIGS. 3A and 3B the real part of the interspectral pressure density has been represented for a pair of points located on the horizontal tail plane or HTP of a T-tail tail plane configuration. In each of these figures the interspectral pressure density estimated by the simulation method of the prior art has been designated by 320, the interspectral pressure density estimated by the method of simulation according to one embodiment of the present invention by 310, and the real interspectral pressure density obtained from the pressure measurements of the sensors located at these points by 330. The interspectral densities are given according to the Strouhal number.

In FIG. 3A the points considered are located close to the leading edge of the tail plane, whereas in FIG. 3B the points considered are located close to the trailing edge.

It is observed in FIG. 3A that the simulation by the method of simulation according to the invention, 310, gives a very satisfactory approximation of the real spectral density, 330, and in any event one which is much better than that obtained with the simulation method of the prior art, 320.

It is observed in FIG. 3B that the interspectral density obtained by the simulation method according to the invention, 310, leads to an overestimate of the real interspectral density, 330. However, the general appearance of the curve is followed, and the approximation is, once again, much better than the one obtained with the simulation method of the prior art, 320.

Figure 4:
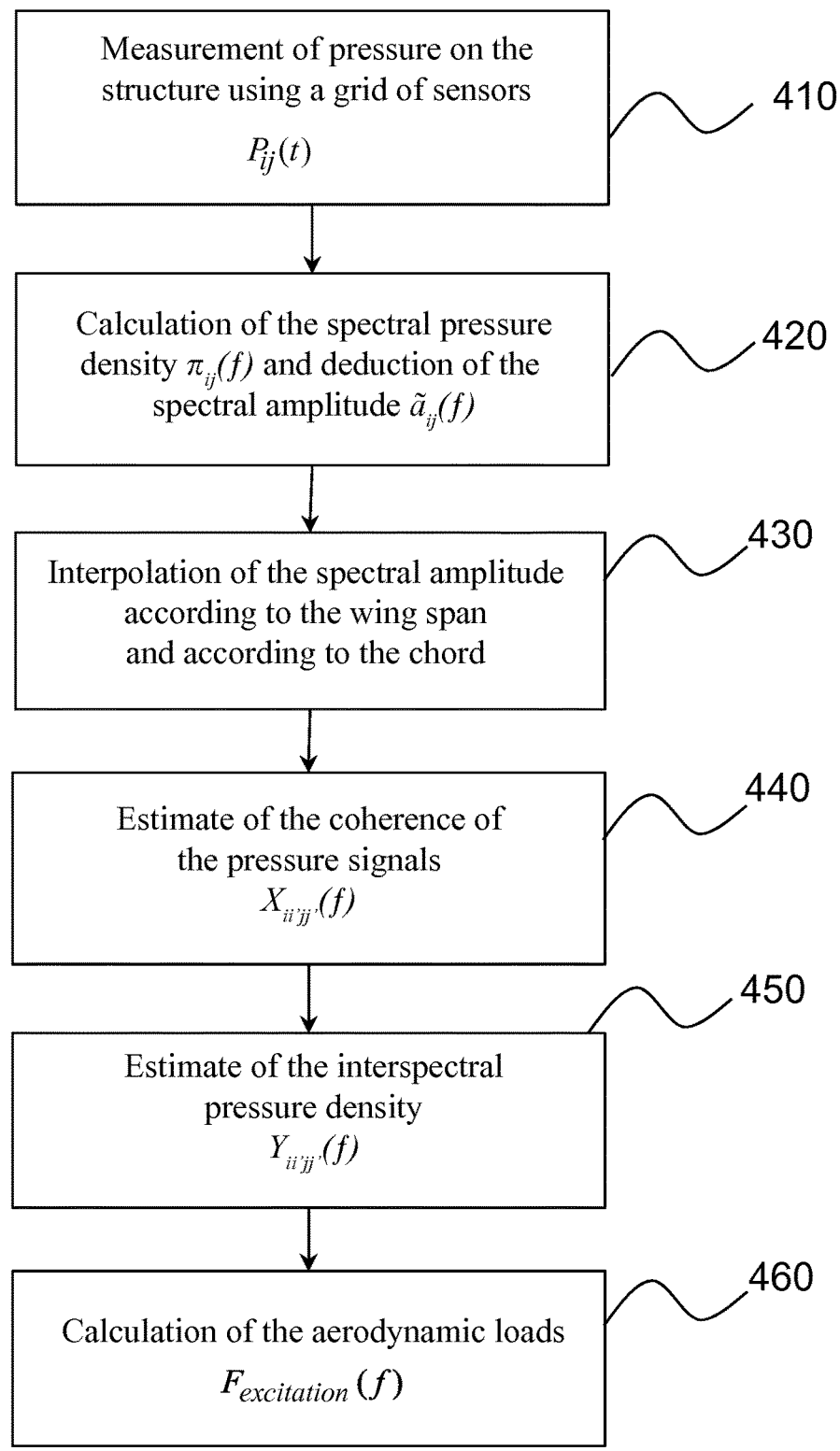
FIG. 4 represents in the form of a block diagram a method of simulation by computer of the unsteady aerodynamic loads on an external structure of the aircraft, according to one embodiment of the invention.

FIG. 4 represents, in the form of a block diagram, a method of simulation by computer of the unsteady aerodynamic loads on an external structure of the aircraft, according to one embodiment of the invention.

This simulation method begins with a step 410, during which a campaign of measurement of the unsteady pressure at the surface of the structure in the course of wind tunnel testing is conducted. The pressure measurements are made using multiple sensors located on the structure and positioned at the first points of a grid. This grid has a first direction in the direction of the flow, and a second direction distinct from the first. The grid interval in the first direction is δx and the grid interval in the second direction δy. Each pressure signal obtained by a sensor is stored in a memory after being sampled.

In step 420, for each of the sensors, or in other words for each of points n of the grid equipped with a sensor, the calculation is made of the spectral density of the pressure signal at this point. The calculation of the spectral density at a point is made from the expression (4), i.e., in practice, by taking segments of duration T of the pressure signal at this point, by applying the Fourier transform of this signal, and by calculating the average of $\tilde{P}_n(f)\tilde{P}_n^*(f)$ for these segments.

In step 430 operations are made to extrapolate/interpolate the spectral density of the pressure in order to determine the spectral pressure density at the points of the grid which are not equipped with sensors.

More specifically, extrapolation is first applied in the second direction. When a sensor is missing at a point of a column of the grid, the spectral density at this point is obtained by extrapolating the spectral density at an adjacent point in the same column. The extrapolation coefficient is determined from the ratio between spectral densities of the corresponding points in the column closest to the one considered.

An interpolation is then made of the spectral density in the first direction, using an interpolation polynomial of degree higher than or equal to 3, for example a cubic spline. The coefficients of the interpolation polynomial may differ according to the line considered.

In step 440 the coherence of the pressure is estimated for each pair of points of the grid or, at the least, for each pair of points belonging to the area of the structure having a separation of the boundary layer. This estimate is based on the original model of the coherence function given by expressions (9) and (10).

To accomplish this, decoherence factors are used in the first and second directions respectively, as calculated in a previous campaign. Alternatively, the decoherence factors are estimated using expressions (11-1) and (11-2), by calculating the coherence of the pressure signals measured by two sensors. The respective propagation speeds of the instability in the first and second directions are also estimated, using expressions (12-1) and (12-2), by calculating the phase gradient of the coherence of the pressure signals measured for pairs of sensors.

In step 450 the interspectral pressure density is estimated for each pair of points of the grid. For a pair of points n,m of the grid the interspectral pressure density is determined, by means of expression (13), from the pressure coherence between these two points, estimated in step 440, and from the spectral pressure density at each of these two points, as calculated in step 420 (if the point is equipped with a pressure sensor), or obtained in step 430 by interpolation (if the point is not so equipped).

Lastly, in step 460, the aerodynamic loads being exerted on the structure are calculated by means of expression (14), or in other words by summing the real part of the interspectral density for the area of the structure having a separation of the boundary layer of the flow.

The determination of the aerodynamic loads $F_{excitation}(f)$ may form part of a method of simulation of the buffeting of the structure in an airflow. In this case, after having estimated the aerodynamic loads as described above, the reduced elasticity equation (2) is resolved. This equation is advantageously resolved in the frequencies space (by applying a Laplace transform), such that it is not necessary to apply an inverse Fourier transform of $F_{excitation}(f)$. To accomplish this, the DLM method or the generalised Euler method may be used, in a known manner.

The invention claimed is:

1. A method of simulation by computer of unsteady aerodynamic loads being exerted on an external structure of an aircraft, positioned in an airflow, the method comprising:
   (a) a step of measurement of pressure by multiple sensors located on the surface of the external structure, and positioned at first plurality of points of a grid having a first direction in a direction of the airflow, and a second direction, separate from the first direction, where the pressure signals of the sensors are stored in a memory;
   (b) a step of calculation of a spectral density of the pressure signals at the first plurality of points of the grid as a spectral pressure density at the first plurality of points;
   (c) a step of extrapolation and/or interpolation of the spectral pressure density at the first plurality of points in order to obtain a spectral pressure density at second plurality of points of the grid, the second plurality of points having no sensor;
   (d) a step of estimation of coherence of pressure for multiple pairs of points of the grid, from a predetermined model of a coherence function;
   (e) a step of calculation of an interspectral pressure density for the multiple pairs of points of the grid, from the coherence of the pressure estimated for these pairs of points, and a spectral pressure density being calculated for the points of these pairs; and
   (f) a step of calculation of the unsteady aerodynamic loads by summing the real part of the interspectral density in the area of the external structure having a separation of the boundary layer of the airflow.

2. The method of simulation according to claim 1, wherein in step (c) the spectral pressure density of the first plurality of points is extrapolated in linear fashion in the second direction and the spectral pressure density of the first plurality of points is interpolated using an interpolation polynomial of degree greater than or equal to three in the first direction.

3. The method of simulation according to claim 1, wherein in step (d) the model of the coherence function $\gamma_{nm}(f)$, for a pair (n,m) of points of the grid, is given by:

$$\gamma_{nm}(f) = \exp\left(-2\pi f\left(\frac{|x_m - x_n|}{\alpha_x(f)} + \frac{|y_m - y_n|}{\alpha_y(f)}\right)\right) \cdot \exp(j\varphi(f, x_m - x_n, y_m - y_n))$$

$$\varphi(f, x_m - x_n, y_m - y_n) = 2\pi f\left(\frac{x_m - x_n}{V_x} + \frac{y_m - y_n}{V_y}\right)$$

where $x_n$, $y_n$ are the respective coordinates of the first point of the pair of points in the first and second directions; $x_n$, $y_n$ are the respective coordinates of the second point of the pair of points in the first and second directions; $V_x$ is a speed of propagation of instability in the first direction; $V_y$ is a speed of propagation of the instability in the second direction, f is a frequency; $\alpha_x$ (f) is a decoherence factor in the first direction and $\alpha_y$ (f) is a decoherence factor in the second direction.

4. The method of simulation according to claim 3, wherein an estimation $\hat{\alpha}_x(f)$ of the decoherence factor in the first direction is calculated by the following average:

$$\hat{\alpha}_x(f) = -\frac{2\pi f \Delta x}{K} \sum_{k=1}^{K} \frac{1}{\ln(|\gamma_k^{\Delta x}(f)|)}$$

where $\gamma_k^{\Delta x}(f)$ is coherence at frequency f between pressure signals measured respectively by two sensors separated by a distance $\Delta x$ in the first direction, and in that an estimation $\hat{\alpha}y(f)$ of the decoherence factor in the second direction is calculated by the following average:

$$\hat{\alpha}_y(f) = -\frac{2\pi f \Delta y}{K} \sum_{k=1}^{K} \frac{1}{\ln(|\gamma_k^{\Delta y}(f)|)}$$

where $\gamma_k^{\Delta y}(f)$ is coherence, at frequency f, of the pressure signals measured respectively by two sensors separated by a distance $\Delta y$ in the second direction, and where K is the number of measurements considered for the average.

5. The method of simulation according to claim 3, wherein an estimation $\hat{V}_x$ of the speed of propagation of the instability in the first direction is calculated from the following average:

$$\hat{V}_x = \frac{2\pi}{\text{Card}(\Omega x)} \sum_{n,m \in \Omega x} \frac{\Delta x_{nm}}{\lambda_{nm}}$$

where $\lambda_{nm}$ is the gradient of a coherence phase, as a function of frequency, of pressure signals measured respectively by two sensors n,m separated by a relative distance $\Delta x_{nm} = x_m - x_n$ in the first direction, $\Omega x$ is a first set of pairs of sensors, and Card ($\Omega x$) is a cardinal of $\Omega x$;

and in that an estimation $\hat{V}_y$ of the speed of propagation of the instability in the second direction is calculated from an average of the following gradient:

$$\hat{V}_y = \frac{2\pi}{\text{Card}(\Omega y)} \sum_{n,m \in \Omega y} \frac{\Delta y_{nm}}{\mu_{nm}}$$

Where $\mu_{nm}$ is the gradient of a coherence phase, as a function of frequency, of the pressure signals measured respectively by two sensors n,m separated by a relative distance $\Delta y_{nm} = y_m - y_n$ in the second direction, and $\Omega_y$ is a second set of pairs of sensors.

6. The method of simulation according to claim 5, wherein the speed of propagation of the instability in the first direction and/or in the second direction is obtained for pairs of sensors the measured pressure signals of these pairs of sensors having a coherence module greater than a predetermined threshold ($\chi_{Th}$).

7. The method of simulation according to claim 1, wherein in step (e) an interspectral pressure density $S_{nm}(f)$ for a pair of points of the grid is obtained by:

$$S_{nm}(f) = \gamma_{nm}(f)\sqrt{S_{nn}(f)}\sqrt{S_{mm}(f)}$$

where $\gamma_{nm}(f)$ is a pressure coherence between the first and second plurality of points of the pair of points; $S_{nn}(f)$ is the spectral pressure density at the first point of the pair of points and $S_{mm}(f)$ is the spectral pressure density at the second point of the pair of points.

8. The method of simulation according to claim 1, wherein in step (f) the aerodynamic loads on the external structure are obtained from:

$$F_{excitation}(f) = \sum_{n,m \in \Omega} \text{Re}(S_{nm}(f))\vec{\sigma}_n \vec{\sigma}_m$$

where $S_{nm}(f)$ is an interspectral pressure density between a first point n and a second point m of the grid, f is a frequency, Re(.) designates the real part, where the surface of the external structure is divided into elementary surfaces associated with the different points of the grid, $\vec{\sigma}_n$ is the vector with norm equal to the elementary surface associated with a first point n and orthogonal to the external structure at this point, $\vec{\sigma}_m$ is the vector with a norm equal to the elementary surface associated with second point m and orthogonal to the external structure at this point, where the summation of the interspectral density is accomplished for a set $\Omega$ of pairs of points of the grid belonging to the area of the external structure having a separation of the boundary layer of said flow.

9. A method of simulation by computer of the buffeting of an external structure of an aircraft in an airflow, wherein a simulation is made of unsteady aerodynamic loads, excitation $F_{excitation}(f)$, being exerted on this external structure according to the simulation method of claim 1, and in that the equation is resolved to the following vibrations:

$$M\ddot{z} + C'\dot{z} + K'z = F_{excitation}$$

where M is the mass matrix of the external structure, C' and K' are respectively the damping and rigidity matrices of the external structure in the wind, and z is the coordinate in the direction orthogonal to the plane of the external structure.

* * * * *